(12) United States Patent
Kuijper et al.

(10) Patent No.: US 11,101,104 B2
(45) Date of Patent: Aug. 24, 2021

(54) MULTI MODAL CRYO COMPATIBLE GUID GRID

(71) Applicant: FEI Company, Hillsboro, OR (US)

(72) Inventors: Maarten Kuijper, Helmond (NL);
Ondrej Ludmil Shanel, Brno (CZ);
Mathijs Petrus van den Boogaard, Boxtel (NL); Pleun Dona, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/557,199

(22) Filed: Aug. 30, 2019

(65) Prior Publication Data
US 2021/0066032 A1  Mar. 4, 2021

(51) Int. Cl.
| | |
|---|---|
| H01J 37/26 | (2006.01) |
| G06K 9/00 | (2006.01) |
| H01J 37/20 | (2006.01) |
| H01J 37/10 | (2006.01) |
| H01J 37/22 | (2006.01) |

(52) U.S. Cl.
CPC ........ *H01J 37/265* (2013.01); *G06K 9/00134* (2013.01); *H01J 37/10* (2013.01); *H01J 37/20* (2013.01); *H01J 37/22* (2013.01)

(58) Field of Classification Search
CPC .. H01J 37/10; H01J 37/20; H01J 37/22; H01J 37/265; H01J 37/29; H01J 37/2599; H01J 37/2955; G06K 9/00134
See application file for complete search history.

(56) References Cited

U.S. PATENT DOCUMENTS

| | | | |
|---|---|---|---|
| 9,594,008 B2* | 3/2017 | Carragher | ................ G01N 1/30 |
| 2008/0250881 A1* | 10/2008 | Dona | ..................... H01J 37/20 73/864.91 |
| 2010/0143198 A1* | 6/2010 | Damiano, Jr. | .......... H01J 37/20 422/400 |

(Continued)

FOREIGN PATENT DOCUMENTS

EP  3739615 A1  11/2020

OTHER PUBLICATIONS

Ted Pella, Inc., Reference/Finder Grids, https://web.archive.org/web/20180130022904/https://www.tedpella.com/grids_html/ref-find.htm, version of Jan. 30, 2018 (Year: 2018).*

(Continued)

*Primary Examiner* — David E Smith

(57) ABSTRACT

Cryo compatible sample grids having multi-modal cryo-EM compatible GUIDs, according to the present disclosure include an outer support structure that defines a region of the grid for holding one or more samples, and a plurality of inner support structures that define a plurality of apertures that are each configured to hold a sample. Cryo compatible sample grids further include a first identifier located on the outer support structure, and a second identifier located within the region of the grid for holding the one or more samples. The first identifier is readable with an optical detector, while the second identifier is readable with an electron detector (e.g., within an electron microscope). Specifically, the second identifier is readable with an electron detector when one or more teeth and/or holes that comprise the second identifier are filled with ice from a vitrification process.

20 Claims, 9 Drawing Sheets

(56) References Cited

U.S. PATENT DOCUMENTS

| | | | |
|---|---|---|---|
| 2014/0203191 A1* | 7/2014 | Buijsse | G02B 21/16 250/459.1 |
| 2016/0032281 A1* | 2/2016 | Utlaut | C12Q 1/6834 506/12 |
| 2016/0189919 A1* | 6/2016 | Passmore | H01J 37/20 250/307 |
| 2017/0004953 A1* | 1/2017 | Glaeser | G01N 1/42 |
| 2017/0207062 A1* | 7/2017 | Dufresne | H01J 37/26 |
| 2019/0250078 A1* | 8/2019 | Braun | G01N 1/2813 |
| 2019/0287759 A1* | 9/2019 | Own | H01J 37/244 |

OTHER PUBLICATIONS

Ted Pella, Inc, Reverence/Finder Grids, https://web.archive.org/web/20180130022904/https://www.tedpella.com/grids_html/ref-find.htm, version of Jan. 30, 2018 (Year: 2018).*

Agar Scientific: "Grids", Aug. 4, 2017, Retrieved from the Internet: URL: https://web.archive.org/web/20170804232735//https: www.agarscientific.com/media/import/01-grids_pgs_1-22_date_17_06_10_web.pdf (Year: 2017).*

Agar Scientific: "Grids", Aug. 4, 2017, Retrieved from the Internet: URL: https://web.archive.org/web/20170804232735/https://www.agarscientific.com/media/import/01-grids_pgs_1-22_date_17_06_10_web.pdf [retrieved on Jan. 25, 2021].

EP20192297.8, Extended European Search Report, dated Feb. 3, 2021, 10 pages.

* cited by examiner

MULTI MODAL CRYO COMPATIBLE GUID GRID

BACKGROUND OF THE INVENTION

Cryogenic electron microscopy (cryo-EM) is an electron microscopy technique in which samples are investigated in at cryogenic temperatures. Specifically, cryo-EM involves samples being immersed in an aqueous solution, the solution is placed within a sample grid, and the sample grid is then subjected to a vitrification process. During the vitrification process, the sample grid/solution(s) thereon are cooled so rapidly that water molecules in the aqueous solution do not have time to crystallize, forming an amorphous solid that does little or no damage to the structure of the samples suspended therein. The samples are then evaluated in an electron microscope at cryogenic temperatures.

Currently, scientists struggle to identify the samples being evaluated by an electron microscope using cryo-EM techniques, as current sample grids do not have a way to be globally identified once the vitrification process occurs. This is because current identification techniques are unreliable or inoperative once the sample grid is subjected to the vitrification process, and/or they introduce excess thermal mass that interferes with the vitrification process.

This introduces huge tracking problems into cryo-EM workflows because vitrification and evaluation are often performed at different times, in different machines, and/or at different locations, resulting in sample grids remaining vitrified for long periods of time. Additionally, as many samples/sample grids may be vitrified and/or stored concurrently, there is a large opportunity for sample grids to be swapped out during the cry-EM workflows. Currently, location-based record-keeping systems are used to identify sample grids, which rapidly become complex and prone to misidentifications. For example, in some labs, sample grids are housed in small storage boxes that can contain 4 to 6 sample grids, which are subsequently stored in storage flasks which can hold 5-10 storage boxes, which can be placed in a flask holder which can hold 6 storage flasks. Since some laboratory drawers can hold 10 flask holders, this means a single such drawer can contain upwards of 1200-3600 sample grids. Therefore, scientists require a global way to identify and track sample grids that operable both before and after vitrification.

SUMMARY OF THE INVENTION

Cryo compatible sample grids having multi-modal cryo-EM compatible GUIDs, according to the present disclosure include an outer support structure that defines a region of the grid for holding one or more samples, and a plurality of inner support structures that define a plurality of apertures. Each of the individual apertures is configured to hold a sample. The Cryo compatible sample grids further include a first identifier located on the outer support structure, and a second identifier located within the region of the grid for holding the one or more samples, wherein the second identifier is readable with an electron microscope. The first identifier is readable with an optical detector, while the second identifier is readable with an electron detector (e.g., within an electron microscope). Specifically, the second identifier is readable with an electron detector when one or more teeth and/or holes that comprise the second identifier are filled with ice from a vitrification process Methods for identifying a cryo compatible sample grid having multi-modal cryo-EM compatible GUIDs, according to the present disclosure comprise using an electron microscope to generate an electron microscope image of a cryo compatible sample grid that has been subjected to a vitrification process, identifying a region of the electron microscope image that includes a vitrification compatible identifier, and determining, based on the vitrification compatible identifier, an identity of the cryo compatible sample grid. The methods may further include storing information relating to the sample grid in a database location associated with the vitrification compatible identifier, accessing information stored in such a database location, and/or taking one or more actions based on information stored in such a database location. The methods may further include reading an additional identifier located on the sample grid with an optical sensor.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

Figure 1:
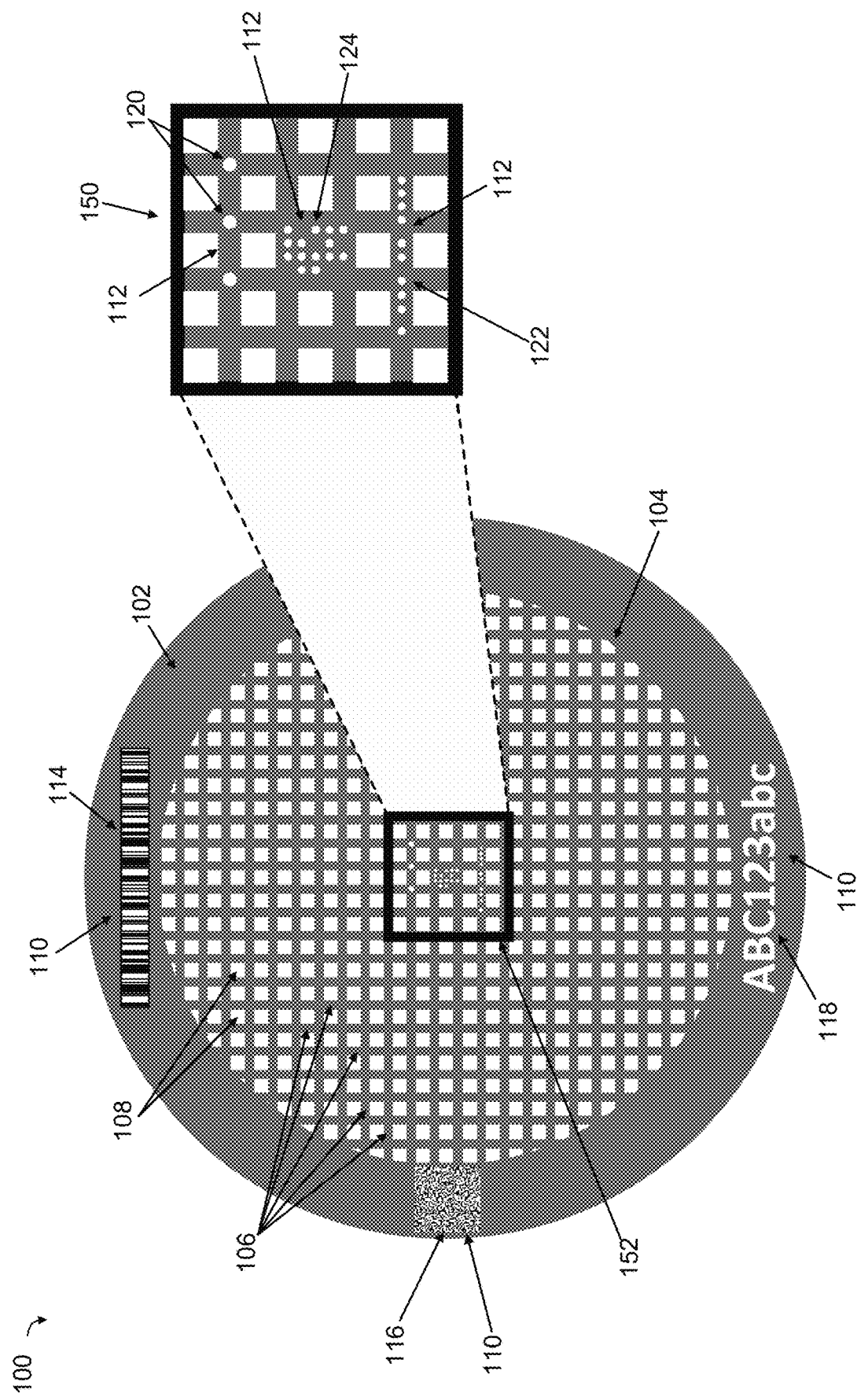
FIG. 1 illustrates example sample grid(s) having multi-modal cryo-EM compatible GUIDs.

Like reference numerals refer to corresponding parts throughout the several views of the drawings. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

DETAILED DESCRIPTION OF EMBODIMENTS

Sample grids having multi-modal cryo-EM compatible GUIDs are disclosed herein. More specifically, the disclosure includes improved cryo-EM sample grids that include a first identifier that is readable optically, and a second identifier that is readable with an electron microscope after the sample grid has been subjected to a vitrification process. Additionally, the present disclosure describes methods for identifying vitrified cryo-EM sample grids in an electron microscope. Such methods may include the electron microscope automatically storing data and/or performing one or more other options based on the second identifier.

FIG. 1 is an illustration of a sample grid 100 having multi-modal cryo-EM compatible GUIDs. FIG. 1 illustrates sample grid 100 as comprising an outer support structure 102 that defines a region of the grid 104 for holding one or more samples. The sample grid 100 is shown as having a circular shape, however it may have other shapes avoiding to the present invention. Specifically, the sample grid 100 may have any shape that allows it to be loaded into and/or operate within a vitrification device, an electron microscope, a sample grid holding device, or other device(s) in the sample evaluation workflow. For example, the sample grid 100 may be shaped so as to be compatible with one or more devices and/or setups for loading one or more samples on the sample grid 100, going through a vitrification process in which the one or more samples are vitrified, and/or facilitating the examination of the vitrified samples with an electron microscope.

The region of the grid 104 for holding one or samples comprises a one or more inner support structures 106 that define a plurality of apertures 108. The inner support structure(s) 106 are rigid support structures that are configured to support and/or hold samples within the one or more apertures 108. For example, FIG. 1 shows the one or more inner support structures 106 as being a plurality of bars (e.g., copper bars) that create a plurality of square apertures 108 for holding samples. Example inner support structure(s) 106 may be composed of many different materials capable of supporting and/or holding samples, such as but not limited to, copper, gold, molybdenum, silicon, silicon-nitride, another crystalline material, another metal, or a combination thereof. In some embodiments, the inner support structures may be component portions of the outer support 102, may be separate structures fastened, glued, welded or otherwise attached to the outer support structure 102, or a combination thereof. The samples may include biological samples that are suspended in a solution. In this way, the solution may be placed in an aperture 108 within the sample grid 100 having multi-modal cryo-EM compatible GUIDs. In some embodiments, the one or more inner support structures 106 comprise a single inner support structure. For example, such an inner support structure may comprise a grid shaped structure that defines the plurality of apertures 108. Alternatively, the inner support structure(s) 106 may be a single structure with regions of varying thickness, and where the plurality of apertures 108 correspond to regions of the single structure having a thickness that allows incident electrons to pass through, causing these regions to be transparent when viewed with a transmission electron microscope.

While not shown in FIG. 1, the apertures 108 may include a structure configured to retain the sample/solution containing the solution within the aperture 108, such as a mesh, a foil, etc. For example, a layer of foil (e.g., carbon foil) may exist on top of one or more inner support structures 106 and extend over one or more of the plurality of inner support structures 108. In this way, when a sample is placed on top of the foil, the foil allows the sample to be positioned above of the plurality of inner support structures 108. In this way, because electrons are allowed to pass through the foil, the samples are visible with a transmission electron microscope.

As further shown in FIG. 1, the sample grid 100 has multi-modal cryo-EM compatible GUIDs. Specifically, the sample grid 100 has one or more first mode cryo-EM compatible GUIDs 110, and one or more second mode cryo-EM compatible GUIDs 112. Each of the first mode cryo-EM compatible GUIDs 110 and the second mode cryo-EM compatible GUIDs 112 are vitrification compatible. That means that they are (1) readable both before and after the sample grid 100 is subjected to a vitrification process, and (2) do not introduce additional thermal mass to the sample grid that interferes with the vitrification process and/or interferes with the vitrification of the solution(s) held within the region of the grid 104.

The first mode cryo-EM compatible GUIDs 110 is located on the outer support structure 102, and are configured to be read with an optical detector. The first mode cryo-EM compatible GUIDs 110 may be printed on the outer support structure 102, imprinted or scratched mechanically to deform the surface, additively marked, laser-etched, surface roughed by a laser or ion-beam, surface restructured with a laser or ion-beam, chemically colored, chemically etched to remove surface material, electrical discharge machined (EDM) to remove surface material, drilled, or applied with a photoresist process. For example, the first mode cryo-EM compatible GUIDs 110 may include a barcode 114, a QR code 116, an alphanumeric code 118, a data matrix, or another optically readable ID.

The second mode cryo-EM compatible GUIDs 112 are located within the region of the grid 104 for holding samples, and are readable with an electron microscope. That is, the second mode cryo-EM compatible GUIDs 112 are configured to be read by an electron microscope after vitrification of the sample grid 100 and during/concurrent with the examination of the samples. FIG. 1 includes an expanded view 150 of a sub-region 152 of the region 104 for holding samples. The second mode cryo-EM compatible GUIDs 112 comprise holes or cutouts through which electrons are allowed to pass through and/or travel to one or more detectors. That is, because the inner support structures 106 must have sufficient mechanical strength to support the samples, the thickness of the inner support structures 106 is such that they block electrons. Because of this, when evaluated and/or analyzed with a transmission electron microscope, the inner support structures 106 appear as dark features (due to their preventing electrons from reaching microscope detectors) and the individual holes or cutouts of the second mode cryo-EM compatible GUIDs 112 appear as light features within the inner support structures 106 (as they allow electrons to pass through the inner support structures 106).

While the holes depicted in FIG. 1 are substantially circular in shape, in different embodiments may have various other shapes such as star, square, etc. Alternatively, the holes may also include half-circle or squared cutouts on the edges of the inner support structures 106. The pattern of the holes in the second mode cryo-EM compatible GUIDs 112 are configured to allow for global identification of the sample grid 100. For example, the sizes of the holes, positioning of the holes, shapes of the holes, spaces between the holes, may be varied and/or otherwise patterned so as to encode one or more identifiers associated with the sample grid 100. In some embodiments, the second mode cryo-EM compatible GUIDs 112 may further encode orientation information relating to the sample grid 100. For example, the second mode cryo-EM compatible GUIDs 112 may encode information about the location of the second mode cryo-EM compatible GUIDs 112 on the sample grid 100 and/or the orientation of the second mode cryo-EM compatible GUIDs 112 in relation to the sample grid 100.

FIG. 1 shows the second mode cryo-EM compatible GUIDs 112 as including a pattern of large cutouts 120 placed at cross points of the inner support structures 106, as a plurality of small cutouts 122 placed along a single inner support structure 106, and a non-linear array of holes 124. A single sample grid 100 may include multiple types of second mode cryo-EM compatible GUIDs 112, and/or a single type of second mode cryo-EM compatible GUIDs 112 may be repeated at multiple locations within the region of the grid 104 for holding one or samples.

Figure 2:
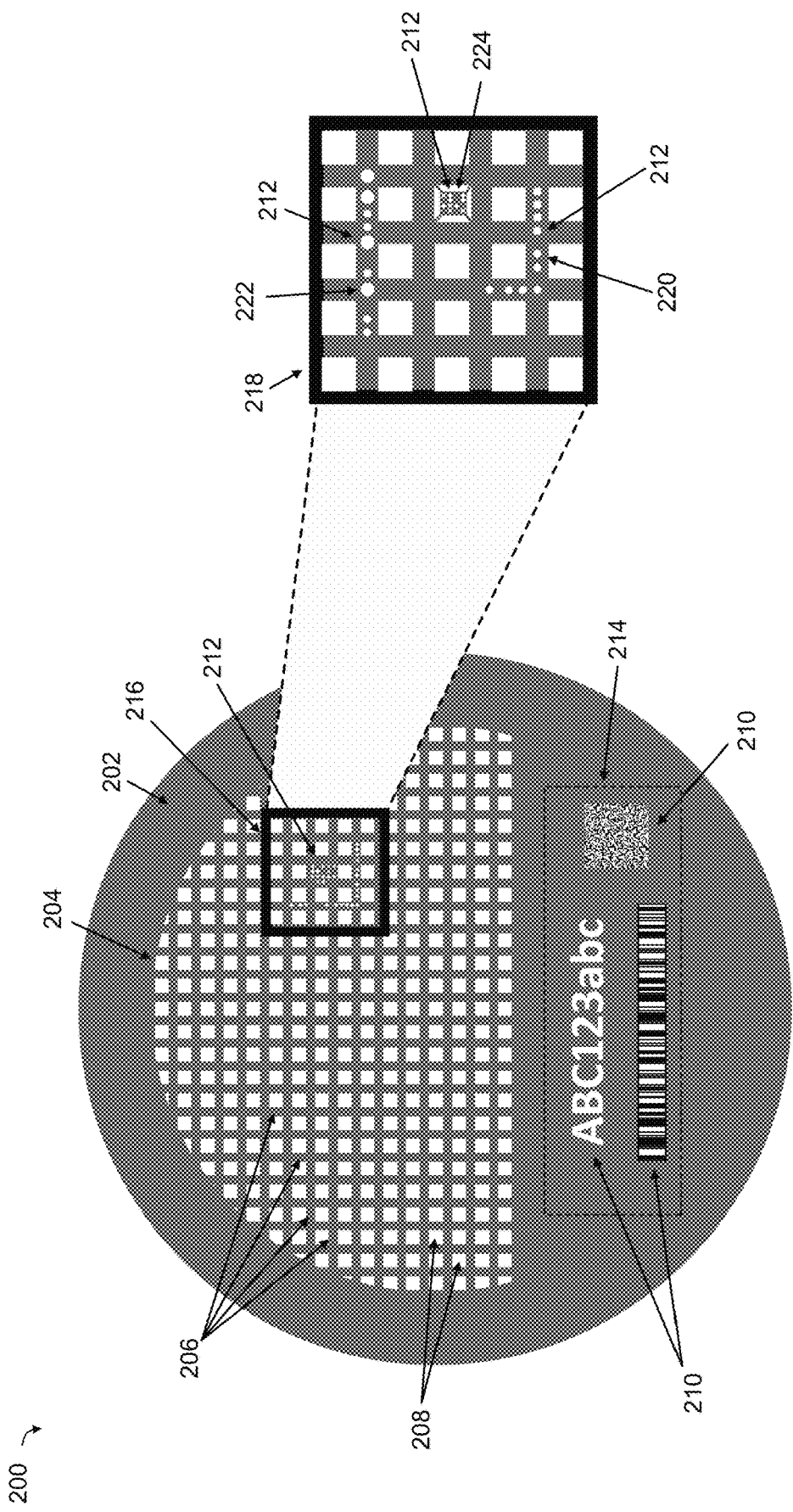
FIG. 2 illustrates alternative example sample grid(s) having multi-modal cryo-EM compatible GUIDs.

FIG. 2 is an illustration of an alternative sample grid 200 having multi-modal cryo-EM compatible GUIDs. FIG. 2 illustrates sample grid 200 are comprising outer support structure 202 that defines a half-circle shaped region of the grid 204 for holding one or more samples. The region of the grid 204 for holding one or samples comprises a plurality of inner support structures 206 that define a plurality of apertures 208.

As further shown in FIG. 2, the sample grid 200 has one or more first mode cryo-EM compatible GUIDs 210, and one or more second mode cryo-EM compatible GUIDs 212. Each of the first mode cryo-EM compatible GUIDs 210 and the second mode cryo-EM compatible GUIDs 212 are vitrification compatible. FIG. 2 illustrates the first mode cryo-EM GUIDs 210 as being co-located within an identification region 214. While each type of first mode cryo-EM GUID is shown as occurring only one time in sample grid 200, in other embodiments the GUIDs may be repeated at multiple locations on the sample grid 200. Additionally, FIG. 2 illustrates the second mode cryo-EM compatible GUIDs 212 as being located in a non-central location 216. As shown in the magnified inset 218 of the non-central location 216, the second mode cryo-EM compatible GUIDs 212 include a non-linear pattern of small holes 220 along two adjoining inner support structures, and a series of holes of varying size 222. FIG. 2 further illustrates an inset structure 224 that is located within an aperture, and which includes a non-linear pattern of holes. The inset structure 224 is thermally isolated from the inner support structures.

Figure 3:
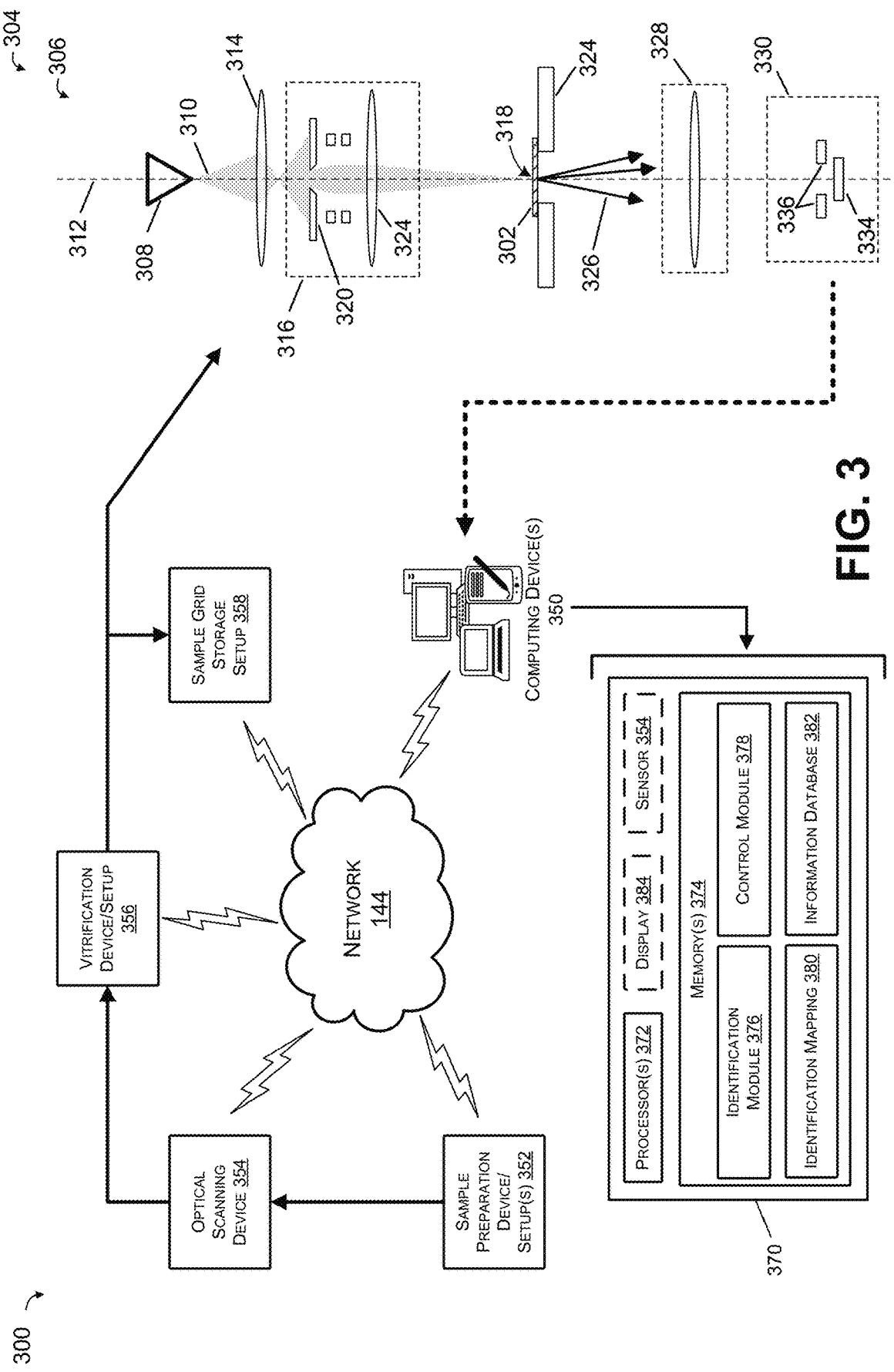
FIG. 3 illustrates an example cryo-EM environment for preparation, vitrification, inspection, and storage, of a sample grid having multi-modal cryo-EM compatible GUIDs.

FIG. 3 is an illustration of example cryo-EM environment 300 for preparation, vitrification, inspection, and storage, of a sample grid 302 having multi-modal cryo-EM compatible GUIDs. Specifically, FIG. 3 shows example cryo-EM environment 300 as including an example cryo-EM system(s) 304 for inspection of a sample grid 302 having multi-modal cryo-EM compatible GUIDs. The example charged particle microscope system(s) 304 may include cryo-electron microscope 304. FIG. 3 shows the example charged particle microscope system(s) 304 as being a cryo-TEM system 306.

The example charged particle microscope system(s) 304 includes a charged particle source 308 (e.g., a thermal electron source, Schottky-emission source, field emission source, etc.) that emits an electron beam 310 along an emission axis 312 and towards an accelerator lens 314. The emission axis 312 is a central axis that runs along the length of the example charged particle microscope system(s) 304 from the charged particle source 108 and through the sample grid 302. The accelerator lens 314 that accelerates/decelerates, focuses, and/or directs the electron beam 310 towards a focusing column 316. The focusing column 316 focuses the electron beam 310 so that it is incident on a sample 318 within the sample grid 302. Additionally, the focusing column 316 may correct and/or tune aberrations (e.g., geometric aberrations, chromatic aberrations) of the electron beam 310.

In some embodiments, the focusing column 316 may include one or more of an aperture 320 and an upper objective lens 324. The focusing column 316 focuses electrons from electron source 308 onto sample 318.

The sample grid 302 may be held by a sample holder 324. Electrons or charged particles 326 passing through and/or emitted by the sample 318 may enter projector 328. In one embodiment, the projector 328 may be a separate part from the focusing column 316. In another embodiment, the projector 328 may be an extension of the lens field from a lens in focusing column 316. The projector 328 may be adjusted by a computing device 350 so that direct electrons or charged particles 326 passed through the sample 318, impinge on a microscope detector system 330.

In Low Magnification TEM (LM mode) the holes that comprise the second identifier of the sample grid 302 may become invisible when filled with a minimal amount of ice. This phenomenon is believed to be due to the small opening aperture (pupil function) of the projection lens system in LM mode because the objective lens is turned off (i.e., as any material like ice will scatter electrons to a larger angle than the acceptance angle in LM hardly any electrons will make it to the camera). However, this phenomenon is overcome when the example cryo-EM 304 is a TEM that is operating in a SA mode with the objective lens enabled. However, it should be noted that the example cryo-EM 304 is not limited to being a TEM in the present disclosure.

FIG. 3 further shows example cryo-EM environment 300 as optionally including a computing device(s) 350, a sample preparation device/setup(s) 352, optical scanning device(s) 354, a vitrification device/setup 356, and a sample grid storage setup 358. FIG. 3 illustrates the computing device(s) 350, a sample preparation device/setup(s) 352, optical scanning device(s) 354, a vitrification device/setup 356, and a sample grid storage setup 358 as being separate, however in various embodiments one or more of these elements may be combined. For example, a computing device 350 and/or an optical scanning device 354 may be incorporated into a single device and/or into other devices (e.g., the sample preparation device/setup(s) 352, a vitrification device/setup 356, and a sample grid storage setup 358, etc.), Those skilled in the art will appreciate that the computing devices 350 depicted in FIG. 3 are merely illustrative and are not intended to limit the scope of the present disclosure. The computing system and devices may include any combination of hardware or software that can perform the indicated functions, including computers, network devices, internet appliances, PDAs, wireless phones, controllers, oscilloscopes, amplifiers, etc. The computing devices 350 may also be connected to other devices that are not illustrated, or instead may operate as a stand-alone system. In addition, the functionality provided by the illustrated components may in some implementations be combined in fewer components or distributed in additional components. Similarly, in some implementations, the functionality of some of the illustrated components may not be provided and/or other additional functionality may be available.

It is also noted that the computing device(s) 350 may be a component of the example charged particle microscope system(s) 304, may be a separate device from the example charged particle microscope system(s) 304 which is in communication with the example charged particle microscope system(s) 304 via a network communication interface, or a combination thereof. For example, an example charged particle microscope system(s) 304 may include a first computing device 350 that is a component portion of the example charged particle microscope system(s) 304, and which acts as a controller that drives the operation of the example charged particle microscope system(s) 304 (e.g., adjust the scanning location on the sample grid 302 by operating the scan coils, etc.). In such an embodiment the example charged particle microscope system(s) 304 may also include a second computing device 350 that is desktop computer separate from the example charged particle microscope system(s) 304, and which is executable to process data received from the microscope detector system 330 to generate images of the sample(s) on the sample grid 302 and/or perform other types of analysis. The computing devices 350 may receive user selections via a keyboard, mouse, touchpad, touchscreen, etc.

The sample preparation device/setup(s) 352 include laboratory setups for preparing the sample and adding the sample to the sample grid 302 having multi-modal cryo-EM compatible GUIDs. For example, the sample preparation device/setup(s) 352 may include devices for mixing a sample to be inspected by example cryo-EM system(s) 304 in a solution such that the sample is suspended in the solution, and/or devices for adding the solution/samples suspended therein to one or more apertures of the sample grid 302. In some embodiments, preparing the sample may include storing the location of individual samples on the sample grid 302 with a computing device 350. For example, the computing device 350 may store a mapping of the individual samples that are stored in the sample grid 302 and/or the locations of each sample on the sample grid 302.

The optical scanning device 354 may correspond to any device capable of optically reading the first identifier on the sample grid having multi-modal cryo-EM compatible GUIDs. For example, the optical scanning device 354 may include a barcode scanner, a QR scanner, a camera, etc. that is capable of detecting the first identifier and either performing an identification process to identify the sample grid 302 and/or interact with a computing device 350 to identify the sample grid 302. Alternatively, or in addition, the optical scanning device 354 may cause information to be stored in an information database associated with the sample grid 302 (e.g., sample information, location of the sample on the sample grid, time stamps, lab identifiers, study information, etc.). In some embodiments, the optical scanning device 354 may be a component sensor of a computing device 350.

The vitrification device/setup 356 includes laboratory setups for subjecting the sample grid 302 to a vitrification process. The vitrification process causes the solution included on the sample grid 302 to be vitrified, allowing the samples suspended therein to be viewed with example cryo-EM system(s) 304. In some embodiments, the vitrification device/setup 356 may include an optical scanning device 354 that is positioned to scan the first identifier on the sample grid, when the sample grid is in the vitrification device/setup 356. Based on the optical scanning device 354 detecting the first identifier, the vitrification device/setup 356 may access a database associated with the sample grid, and take actions according to information in the database (e.g., adjust settings, perform vitrification, cause additional information to be stored in the database, cause information to be presented to a user on a graphical user interface on a display associated with the vitrification device/setup 356, etc.).

Once the sample grid 302 has been subjected to the vitrification process, it must be kept at a low temperature so that the solution remains vitrified. This inhibits the ability of optical scanning devices 354 to scan the first identifier of the sample grid 302 having multi-modal cryo-EM compatible GUIDs. The sample storage setup 358 may include a short term storage unit (e.g., a transportation flask) that allows the sample grid 302 to be transported between the vitrification device/setup 356 and the example cryo-EM system(s) 304. Alternatively, the sample storage setup 358 may include long term storage where the sample grid 302 can be held before and/or after it is examined by the example cryo-EM system(s) 304.

FIG. 3 further includes a schematic diagram illustrating an example computing architecture 370 of the computing devices 350. Example computing architecture 370 illustrates additional details of hardware and software components that can be used to implement the techniques described in the present disclosure. In the example computing architecture 370, the computing device includes one or more processors 372 and memory 374 communicatively coupled to the one or more processors 372.

The example computing architecture 370 can include an identification module 376 and a control module 378 stored in the memory 374. The example computing architecture 370 is further illustrated as including an identification mapping 380 and an information database 382 stored on memory 374. The identification mapping 380 is a data structure that maps together the first identifier, the second identifier, and identifying information about the sample grid 302. The information database 382 is a database that includes information associated with the sample grid 302 and/or other sample grids. For example, the information database 382 may include information relating to the sample(s) present on the sample grid 302, the location of samples on the sample grid 302, the location of the sample grid 302, sensor data/image data generated of the sample grid and/or the samples thereon, EM microscope settings, EM protocols, etc.

As used herein, the term "module" is intended to represent example divisions of executable instructions for purposes of discussion, and is not intended to represent any type of requirement or required method, manner or organization. Accordingly, while various "modules" are described, their functionality and/or similar functionality could be arranged differently (e.g., combined into a fewer number of modules, broken into a larger number of modules, etc.). Further, while certain functions and modules are described herein as being implemented by software and/or firmware executable on a processor, in other instances, any or all of modules can be implemented in whole or in part by hardware (e.g., a specialized processing unit, etc.) to execute the described functions. In various implementations, the modules described herein in association with the example computing architecture 370 can be executed across multiple computing devices 350.

The identification module 376 can be executable by the processors 372 to determine an identity of the sample grid 302 based at least in part on the first identifier or the second identifier. The identification module 376 may also identify the orientation of the sample grid 302 in the example cryo-EM system(s) 304 based on the second identifier. For example, the identification module 376 may access the identification mapping 380 and determine the identity of the sample grid 302 based on the first identifier or the second identifier. In response to the computing device 350 receiving sensor information from the example cryo-EM system(s) 304 that depicts the second identifier, the identification module 376 may determine the identity of the sample grid 302. In some embodiments, the identification module 376 may be configured to automatically detect that the second identifier is located within the sensor data of the example cryo-EM system(s) 304 and may automatically identify the sample grid 302 based on the automated detection of the sample grid 302.

Where the identification module 376 detects that a portion of the second identifier is located in the sensor data of the example cryo-EM system(s) 304, the identification module 376 may cause the of the example cryo-EM system(s) 304 to manipulate the sample grid 302 and/or focusing column 316 such that the remaining portion of the second identifier is included in the sensor data. For example, to improve the visibility of the second identifier the identification module 376 may cause an adjustment of the focusing column 316 that defocuses the electron beam 310 such that it is focused upon a bottom surface of the sample grid 302 that is facing away from the electron source 308. In some embodiments, the identification module 376 may montage and/or stitch the sensor data together so that the entirety of the second identify is included, and may perform an identification of the sample grid 302 based on the montaged and/or stitched sensor data. In another example, in response to the computing device 350 receiving sensor information from the optical scanning device 354 that depicts the first identifier, the identification module 376 may use the identification mapping 380 to determine the identity of the sample grid 302. The identification module 376 may be further executable to cause the identity of the sample grid 302 to be sent to and/or presented on the example cryo-EM system(s) 304, the optical scanning device 354, and/or the display 384 of a computing device 350.

The control module 378 can be executable by the processors 372 to cause a computing device 250 and/or example cryo-EM system(s) 304 to take one or more actions and/or present information. In some embodiments, the control module 378 may be executable to adjust the settings of the example cryo-EM system(s) 304, cause the example cryo-EM system(s) 304 to perform particular operations, or a combination thereof. For example, the control module 378 may be executable to access a portion of the information database 382 associated with the sample grid 302 that identifies microscope settings for the sample grid 302 and/or the samples thereon, and then cause the example cryo-EM system(s) 304 to have the microscope settings identified in the information database 382. In another example, the control module 378 may access a portion of the information database 382 that identifies the location of samples on the sample grid 302, and may cause the example cryo-EM system(s) 304 to automatically image the samples on the sample grid 302. Where the example cryo-EM system(s) 304 includes a focused ion beam (FIB) the control module 378 may also be executable to cause one or more of the sample grid to be moved and/or the FIB to be adjusted, and then cause the cryo-EM system(s) 304 to automatically begin a milling process. For example, the database may include instructions for certain areas that are to be milled, and the cryo-EM system(s) 304 may automatically mill those certain areas based on the instructions.

Alternatively, or in addition, the control module 378 may cause a display 384 to present a protocol to be presented to a user, present information about the sample grid 302, etc. In some embodiments, the control module 378 may cause the display 384 to present a graphical user interface that includes selectable interfaces that allow a user to input and/or alter data associated with the sample grid 302 and/or select protocol steps to be performed by the example cryo-EM system(s) 304. The control module 378 may be further executable to cause information from the example cryo-EM system(s) 304, the optical scanning device 354, and/or information that was input into the computing device 350 by a user to be stored in the information database 382. For example, the control module 378 may cause sensor data and/or images from the example cryo-EM system(s) 304 to be stored in the information database 382 in association with the first identifier, the second identifier, and/or the sample grid 302.

The computing devices 350 include one or more processors configured to execute instructions, applications, or programs stored in a memory(s) accessible to the one or more processors. In some examples, the one or more processors may include hardware processors that include, without limitation, a hardware central processing unit (CPU), a graphics processing unit (GPU), and so on. While in many instances the techniques are described herein as being performed by the one or more processors, in some instances the techniques may be implemented by one or more hardware logic components, such as a field programmable gate array (FPGA), a complex programmable logic device (CPLD), an application specific integrated circuit (ASIC), a system-on-chip (SoC), or a combination thereof.

The memories accessible to the one or more processors are examples of computer-readable media. Computer-readable media may include two types of computer-readable media, namely computer storage media and communication media. Computer storage media may include volatile and non-volatile, removable, and non-removable media implemented in any method or technology for storage of information, such as computer readable instructions, data structures, program modules, or other data. Computer storage media includes, but is not limited to, random access memory (RAM), read-only memory (ROM), erasable programmable read only memory (EEPROM), flash memory or other memory technology, compact disc read-only memory (CD-ROM), digital versatile disk (DVD), or other optical storage, magnetic cassettes, magnetic tape, magnetic disk storage or other magnetic storage devices, or any other non-transmission medium that may be used to store the desired information and which may be accessed by a computing device. In general, computer storage media may include computer executable instructions that, when executed by one or more processing units, cause various functions and/or operations described herein to be performed. In contrast, communication media embodies computer-readable instructions, data structures, program modules, or other data in a modulated data signal, such as a carrier wave, or other transmission mechanism. As defined herein, computer storage media does not include communication media.

Those skilled in the art will also appreciate that items or portions thereof may be transferred between memory and other storage devices for purposes of memory management and data integrity. Alternatively, in other implementations, some or all of the software components may execute in memory on another device and communicate with the computing devices 350. Some or all of the system components or data structures may also be stored (e.g., as instructions or structured data) on a non-transitory, computer accessible medium or a portable article to be read by an appropriate drive, various examples of which are described above. In some implementations, instructions stored on a computer-accessible medium separate from the computing devices 350 may be transmitted to the computing devices 350 via transmission media or signals such as electrical, electromagnetic, or digital signals, conveyed via a communication medium such as a wireless link. Various implementations may further include receiving, sending or storing instructions and/or data implemented in accordance with the foregoing description upon a computer-accessible medium.

Figure 4:
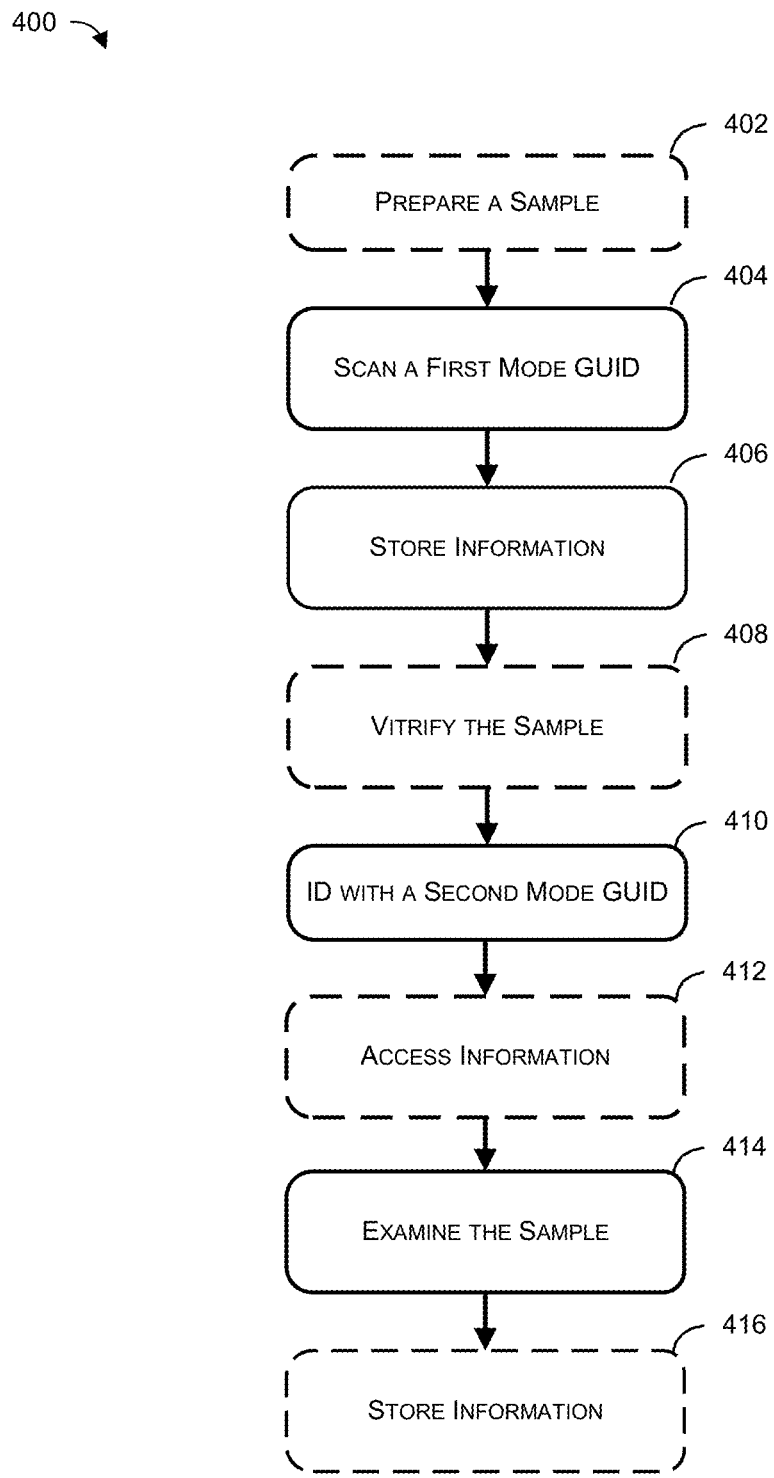
FIG. 4 depicts a sample process for evaluating samples with a sample grid having multi-modal cryo-EM compatible GUIDs.

FIG. 4 is a flow diagram of illustrative processes illustrated as a collection of blocks in a logical flow graph, which represent a sequence of operations that can be implemented in hardware, software, or a combination thereof. In the context of software, the blocks represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the processes.

FIG. 4 is a depicts a sample process 400 for evaluating samples with a sample grid having multi-modal cryo-EM compatible GUIDs. The process 400 may be implemented with any of the sample grids 100 and 200, in any of the example cryo-EM environment 300 and/or by the computing device(s) 350 described above, or in other environments and computing devices.

At 402, a sample is prepared and placed on a sample grid having multi-modal cry-EM compatible GUIDs. In some embodiments preparing the sample comprises mixing a sample that is to be evaluated on a cryo-EM in a solution such that the sample is suspended in the solution, and/or adding the solution/samples suspended therein to one or more apertures of a sample grid having multi-modal cryo-EM compatible GUIDs.

At step 404, a first mode GUID of the sample grid is scanned. Specifically, the first mode GUID of the sample grid is scanned with an optical scanning device that is capable of optically reading the first mode GUID on the sample grid having multi-modal cryo-EM compatible GUIDs. For example, the optical scanning device may be a barcode scanner, a QR scanner, a camera, or other type of optical scanner that is capable of detecting the first mode GUID. In some embodiments, scanning the sample grid includes identifying the sample grid based on the first mode GUID. In some embodiments, the first mode GUID of the sample grid is scanned prior to the preparation of the sample and/or the placement of the sample on the sample grid.

At step 406, information about the sample grid and/or the samples thereon are stored. Specifically, information about the sample grid and/or the samples thereon are stored in a database location associated with the first mode GUID, second mode GUID, and/or the sample grid. The information may include sample information, location of the sample on the sample grid, time stamps, lab identifiers, study information, or other information associated with the sample grid. The information may be input by a user, or the information may be automatically generated by the optical scanner and/or another device. For example, where the optical scanner is associated with a storage system, the storage system may cause the location at which the sample grid is stored to be included in the database.

At 408, the sample grid and the samples thereon are subjected to a vitrification process. The vitrification process causes the solution included on the sample grid to be vitrified, allowing the samples suspended therein to be viewed with a cryo-EM. In some embodiments, a vitrification device may include an optical scanning device that is positioned to scan the first mode GUID on the sample grid, and then the vitrification device may access a database associated with the sample grid, and take actions according to information in the database (e.g., adjust settings, perform vitrification, cause additional information to be stored in the database, cause information to be presented to a user on a graphical user interface on a display associated with the vitrification device, etc.). Once the sample grid has been subjected to the vitrification process, it must be kept at a low temperature so that the solution remains vitrified.

At 410, the sample is identified with a second mode GUID. Specifically, the cryo-EM determines that a second mode GUID is located within a region of the sample grid that is being evaluated, and identifies the sample grid based on the second mode GUID. For example, the second mode GUID comprises holes, teeth, or cutouts that allow the passage of electrons through the sample grid such that they are detected by one or more detectors of the cryo-EM. In this way, the cryo-EM is able to visualize the second mode GUID even when one or more of the teeth, cutouts, and/or holes that comprise the second identifier are filled with ice from the vitrification process. To improve the visibility of the second mode GUID, the focus of the electron beam of cryo-EM may be adjusted such that it is focused upon the bottom side of the sample grid and/or the exit plane of the holes that comprise the second mode GUID. For example, in some embodiments reading the cryo-EM compatible GUID may include the cryo-EM automatically defocusing the electron beam of the electron microscope such that it is focused upon onto the bottom side of the inner support structures of the sample grid.

In some embodiments, the cryo-EM may detect that a portion of the second mode GUID is present in a first area of the sample grid, and may cause a second area of the sample grid to be viewed so that a remaining portion of the second mode GUID is detected by the cryo-EM. In some embodiments, the sample grid is identified with a first portion of the second mode GUID and the orientation of the sample grid and/or the location of the second mode GUID on the sample grid is identified with a second portion of the second mode GUID.

At step 412, and information associated with the second mode GUID and/or the sample grid is optionally accessed. In some embodiments, the information about the sample grid and/or the samples may be stored in a location of a database associated with the first mode GUID, the second mode GUID, and/or the sample grid. The information associated with the second mode GUID and/or the sample grid is presented on a graphical user interface on a display of the cryo-EM microscope or an associated computing device. Alternatively, or in addition, the information accessed may be used to cause the cryo-EM to perform one or more actions, such as, changing the settings of the cryo-EM, cause the cryo-EM to image the samples on the sample grid automatically, cause one or more of the sample grid to be moved and/or a FIB to be adjusted, and then initiate a milling process.

At 414, the sample grid and/or the samples thereon are examined with a cryo-EM. For example, the sample grid having multi-modal cry-EM compatible GUIDs may be examined with a transmission electron microscope that is operating in a SA mode with the objective lens enabled. In some embodiments, where operating conditions are stored in a database in association with the second mode GUID and/or the sample grid, the settings of the cryo-EM may modified according to the stored operating conditions. In this way, the cryo-EM may automatically adjust its performance and/or evaluation process based on information and/or settings previously stored in association with the second mode GUID and/or the sample grid.

At 416, information about the sample grid and/or the samples thereon may be optionally stored. Specifically, the information about the sample grid and/or the samples thereon is stored in a location of a database associated with the first mode GUID, the second mode GUID, and/or the sample grid. This information may include images of the samples on the sample grid generated by the cryo-EM, information about the sample, information about the cryo-EM, etc. The information may be generated by the cryo-EM (or an associated computing device) or it may be input by a user.

FIGS. 5-10 illustrations of example cryo-EM compatible GUIDs that can be imaged with a cryo-EM after being exposed to a vitrification process. Cryo-EM compatible GUIDs according to the present invention are not limited to those illustrated in FIGS. 5-10. Additionally, the cryo-EM compatible GUIDs illustrated in FIGS. 5-10 may be used in combination with each other, or a cryo-EM compatible GUIDs according to the present disclosure may comprise a combination of features depicted in different FIGS. 5-10.

Figure 5:
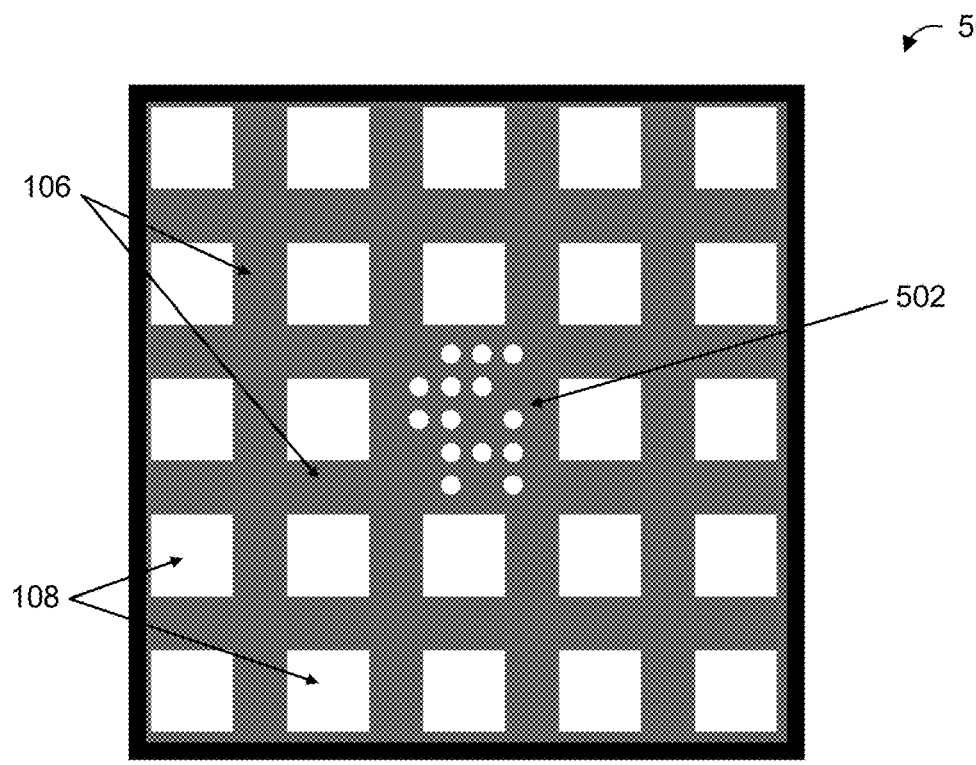
FIG. 5 is a diagram that shows a portion of a cryo-EM compatible sample grid that includes a cryo-EM compatible GUID that comprises a non-linear arrangement of holes.

FIG. 5 illustrates a portion of a cryo-EM compatible sample grid 500 that includes a cryo-EM compatible GUID that comprises a non-linear arrangement of holes. Specifically, FIG. 5 illustrates a portion of a cryo-EM compatible sample grid 500 that includes a plurality of inner support structures 106 that define a plurality of apertures 108 for holding samples. Although not depicted in FIG. 5, the apertures 108 may include a carbon foil configured to hold the sample while allowing the sample to be examined by a cryo-EM system. The non-linear arrangement of holes 502 is shown as being an arrangement of substantially circular holes. In some embodiments, a portion of the non-linear arrangement of holes may encode a global identifier, and a different portion of the non-linear arrangement of holes may encode an orientation of the identifier and/or sample grid.

Figure 6:
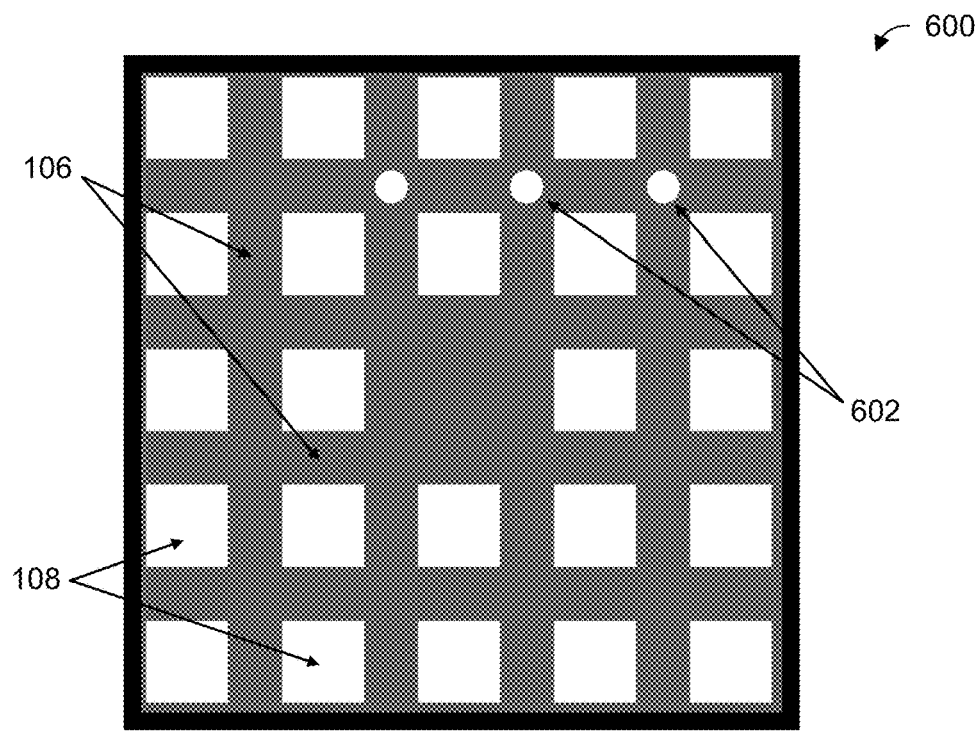
FIG. 6 is a diagram that shows a portion of a cryo-EM compatible sample grid that includes a cryo-EM compatible GUID that comprises individual holes located at intersections of inner support structures.
Figure 7:
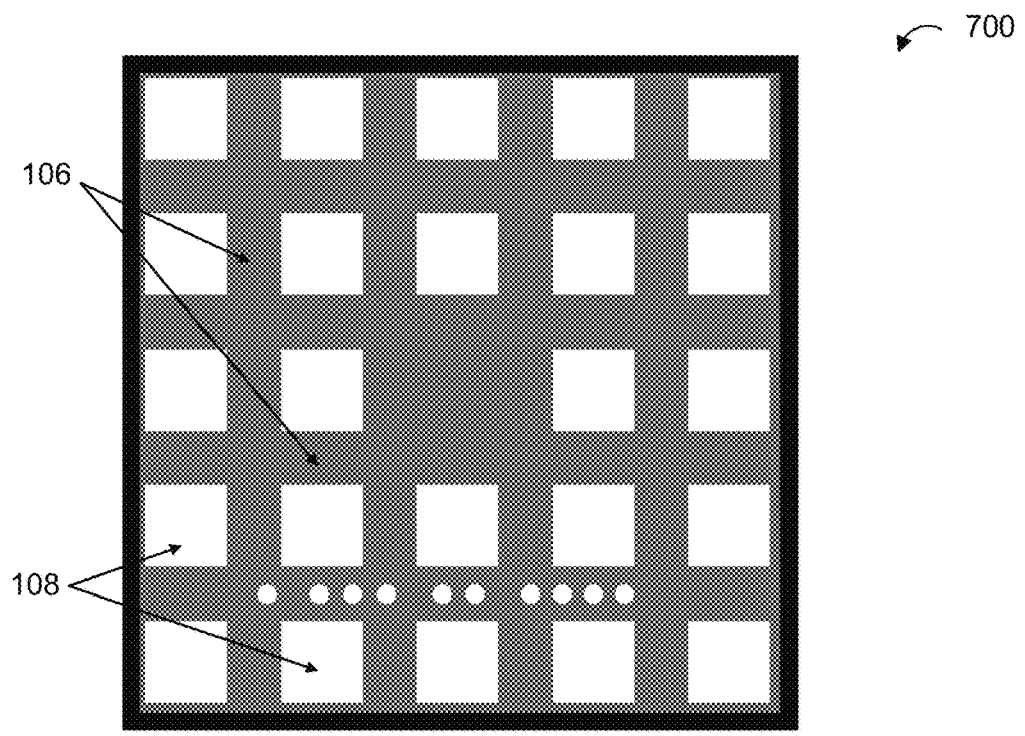
FIG. 7 is a diagram that shows a portion of a cryo-EM compatible sample grid that includes a cryo-EM compatible GUIDs that comprises a linear arrangement of holes along an inner support structure.

FIG. 6 illustrates a portion of a cryo-EM compatible sample grid 600 that includes a cryo-EM compatible GUID 602 that comprises individual holes located at intersections of inner support structures. FIG. 7 illustrates a portion of a cryo-EM compatible sample grid 700 that includes a cryo-EM compatible GUIDs 702 that comprises a linear arrangement of holes along an inner support structure. While FIGS. 5-7 depict each of the holes of GUIDs 502, 602, and 702 as being of the sample size and shape, in other embodiments individual holes may have different sizes and/or shapes.

Figure 8:
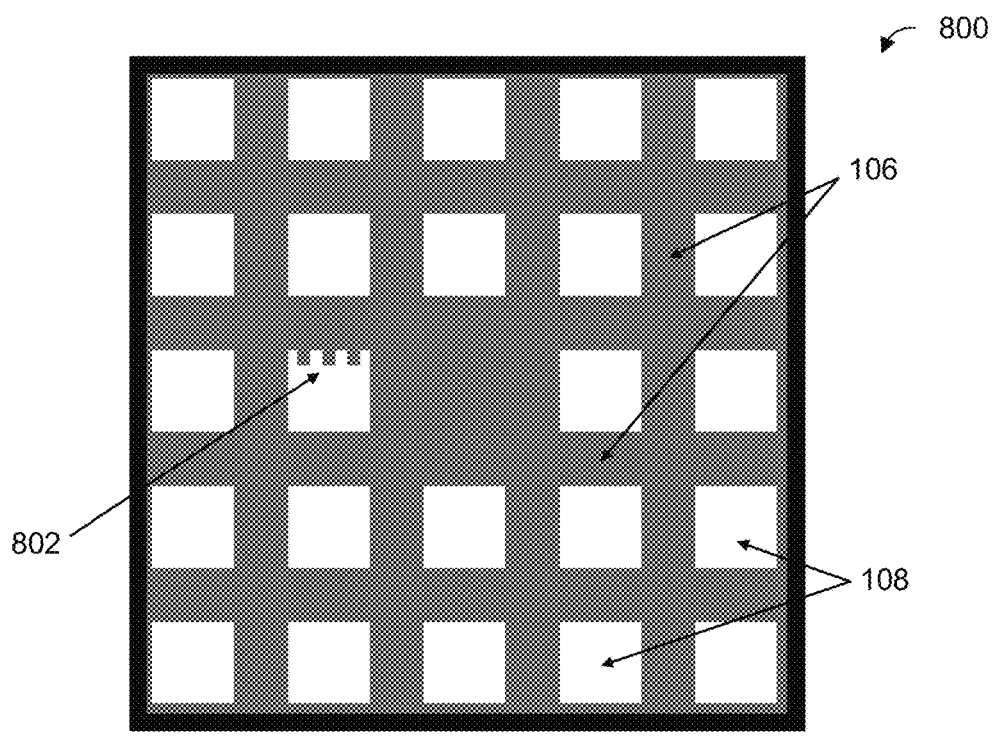
FIG. 8 is a diagram that shows a portion of a cryo-EM compatible sample grid that includes a cryo-EM compatible GUIDs that comprises a plurality of teeth projecting into an aperture.
Figure 9:
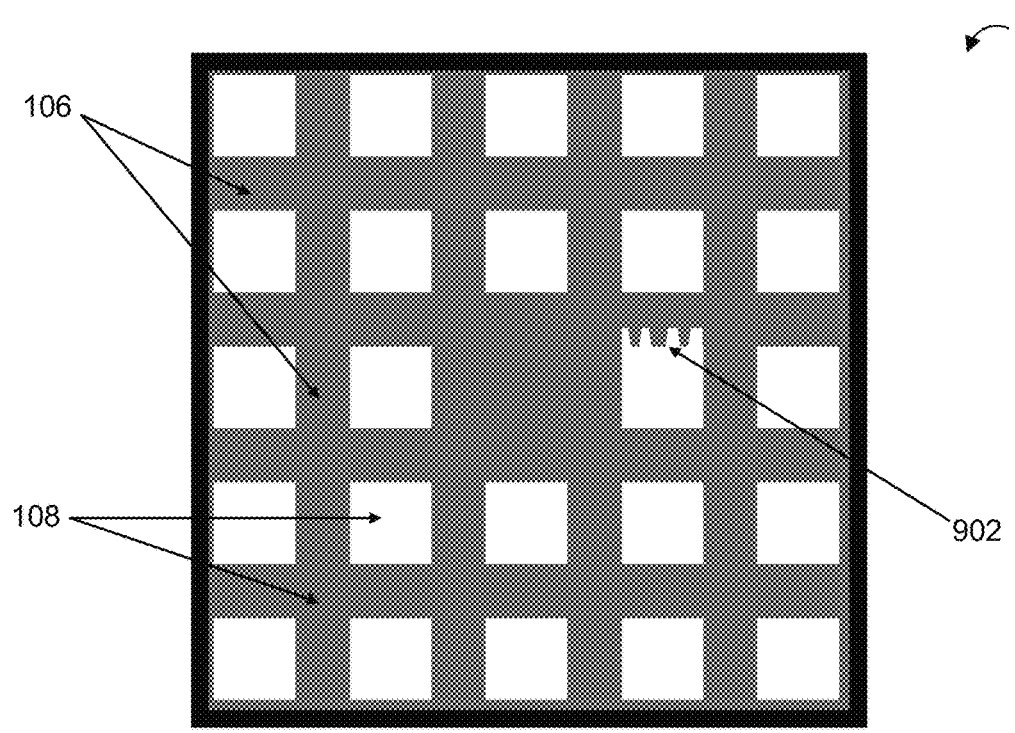
FIG. 9 is a diagram that shows a portion of a cryo-EM compatible sample grid that includes a cryo-EM compatible GUIDs that cutouts that project into a support structure.

FIG. 8 illustrates a portion of a cryo-EM compatible sample grid 800 that includes a cryo-EM compatible GUIDs 802 that comprises a plurality of teeth projecting into an aperture 108. Similarly, FIG. 9 illustrates a portion of a cryo-EM compatible sample grid 900 that includes a cryo-EM compatible GUIDs 902 that cutouts that project into a support structure 106. In some embodiments, while depicted as having a uniform size and shape in each of FIGS. 8 and 9, the size and shape of the cutouts and/or teeth may be varied within a GUID.

Figure 10:
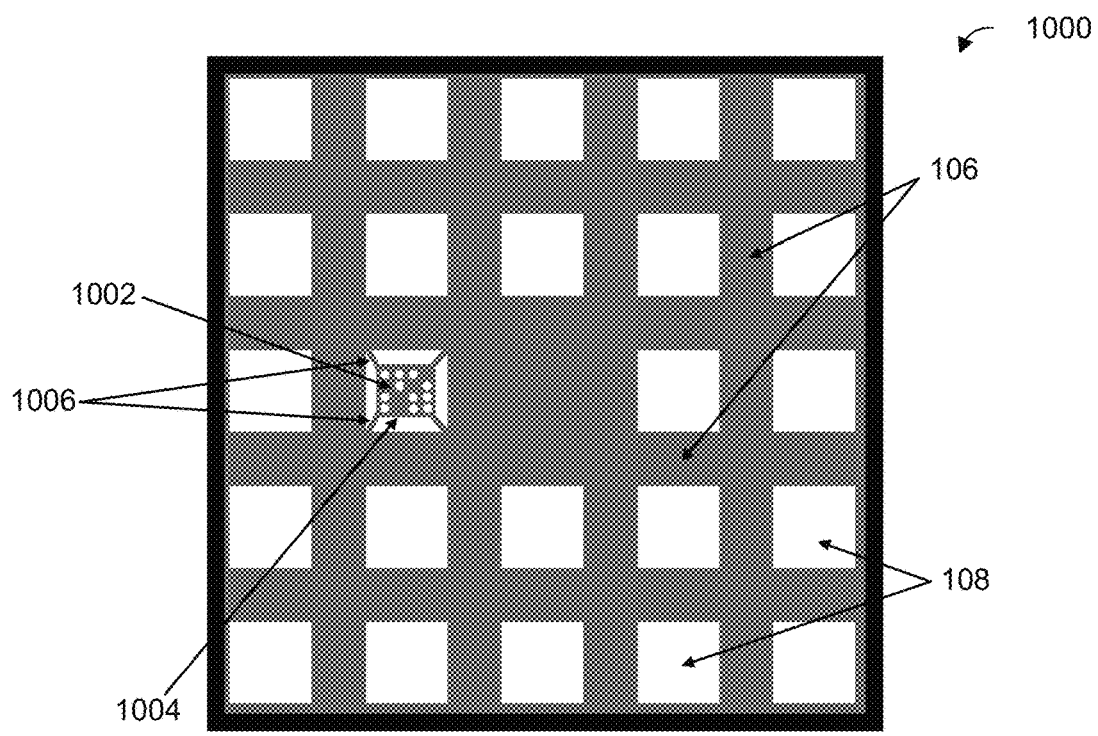
FIG. 10 is a diagram that shows a portion of a cryo-EM compatible sample grid that includes a cryo-EM compatible GUIDs that non-linear arrangement of holes on an identification surface.

FIG. 10 illustrates a portion of a cryo-EM compatible sample grid 1000 that includes a cryo-EM compatible GUIDs 1002 that non-linear arrangement of holes on an identification surface 1004. The identification surface 1004 is located within an aperture 108, and is thermally isolated from the plurality of inner support structures 106 by one or more connecting bridges 1006. Each individual connecting bridge 10006 are configured to thermally isolate the identification surface 1004 from the one or more inner support structures 106.

Figure 11:
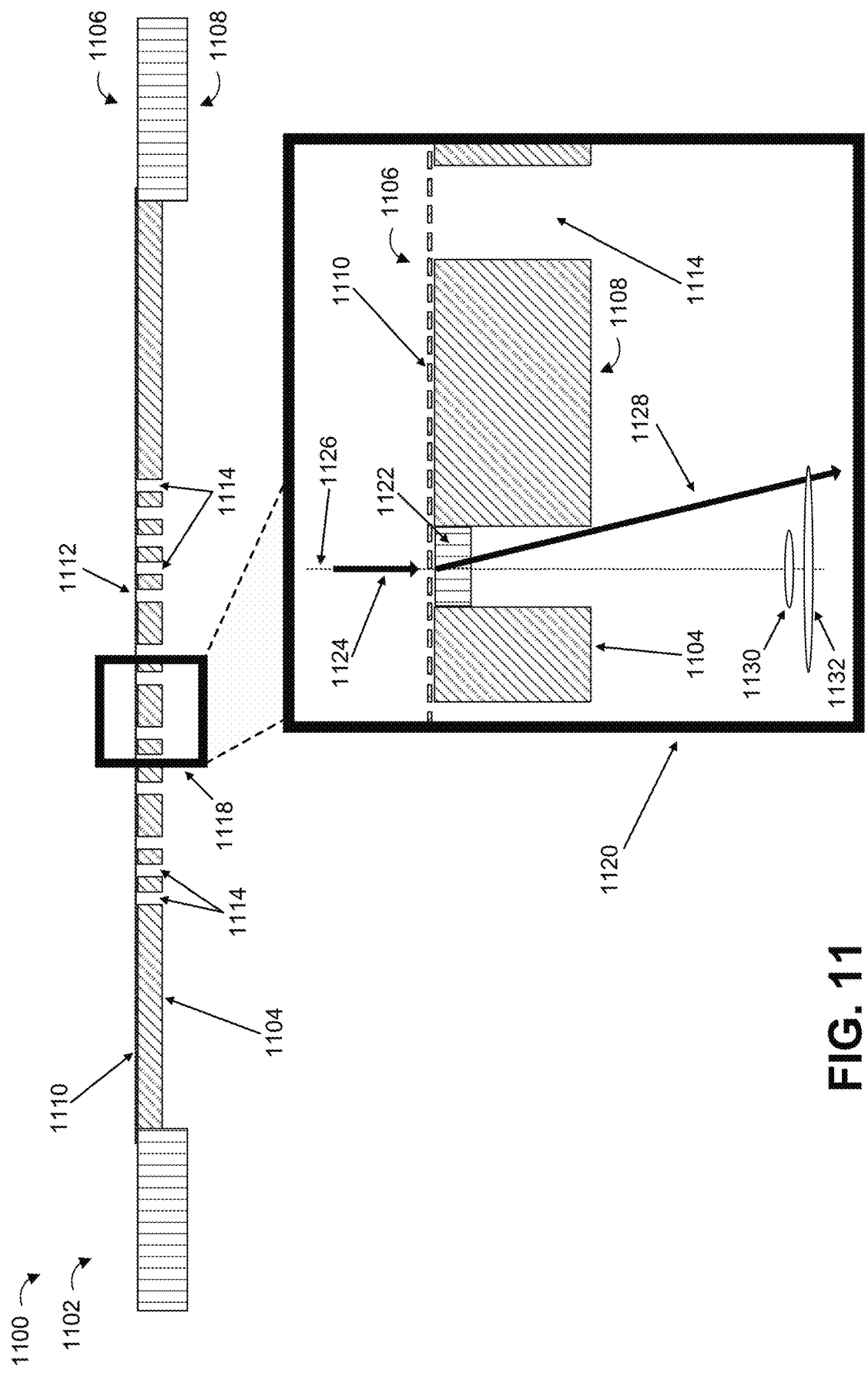
FIG. 11 is a diagram that shows cross sectional views of a sample grid having multi-modal cryo-EM compatible GUIDs that illustrates the performance of the second mode cryo-EM GUIDs after vitrification of the sample grid.

FIG. 11 illustrates cross sectional views 1100 of a sample grid having multi-modal cryo-EM compatible GUIDs that illustrates the performance of the second mode cryo-EM GUIDs after vitrification of the sample grid. Specifically, FIG. 11 illustrates a cross sectional view of sample grid 1102 that bisects along a length of an inner support structure 1104. Sample grid 1102 is shown as having a top side 1106 that faces an electron source when positioned for evaluation in a microscope, and a bottom side 1108 that is opposite the top side 1106. FIG. 11 further depicts a foil 1110 (e.g., a carbon foil) positioned on the top side 1106 of the sample grid 1102. A cryo-EM compatible GUID 1112 comprising a plurality of holes 1114 drilled in the inner support structure 1104 is also depicted.

Additionally, FIG. 11 includes an exploded view 1120 of a region 1118 of the sample grid 1102 that illustrates the operation of the cryo-EM compatible GUID 1112 after the vitrification of the sample grid 1102. Specifically, exploded view 1120 illustrates the detectability of the cryo-EM compatible GUID 1112 when one or more of the plurality of holes 1114 is partially or completely obscured by dirt or ice 1122. An electron entrance path 1124 is depicted along an electron axis 1126 that electron from an electron source takes to be incident on the sample grid 1102, and an electron scatter path 1128 that illustrates the path of the electron after it has been scattered by the dirt or ice 1122 in a hole 1114. The exploded view 1116 also shows a first pupil diameter 1130 of a projector lens when the microscope is in LM mode (with the objective lens is turned off), and a second pupil diameter 1132 a projector lens when the microscope is in SA mode (with the objective lens enabled). When operating in LM mode such a typical projector lens has a semi angle that corresponds to 13 mrad, while such a projector lens typically has a semi angle that corresponds to 130 mrad when operating in SA mode.

As discussed above, an individual hole 1114 is visible in an electron microscope because electrons can pass through the individual hole 1114 and into a lens that directs the electrons to a detection system. This means that for an individual hole 1114 to be visible in the electron microscope the electron scatter path 1128 must cross the pupil diameter of the projector lens. For this reason, the cryo-EM compatible GUID 1112 is more visible in an electron microscope when the microscope operates in SA mode. Additional improvements of the detection of electrons passing through the plurality of holes 1114 can be achieved by defocusing the electron beam to the bottom side 1108 of the inner support structure 1104 and/or the exit plane of the hole of the plurality of holes 1114. For example, in some embodiments reading the cryo-EM compatible GUID 1112 may include focusing the electron beam of the electron microscope onto the bottom side 1108 of the inner support structures 1104 of the sample grid.

Figure 12:
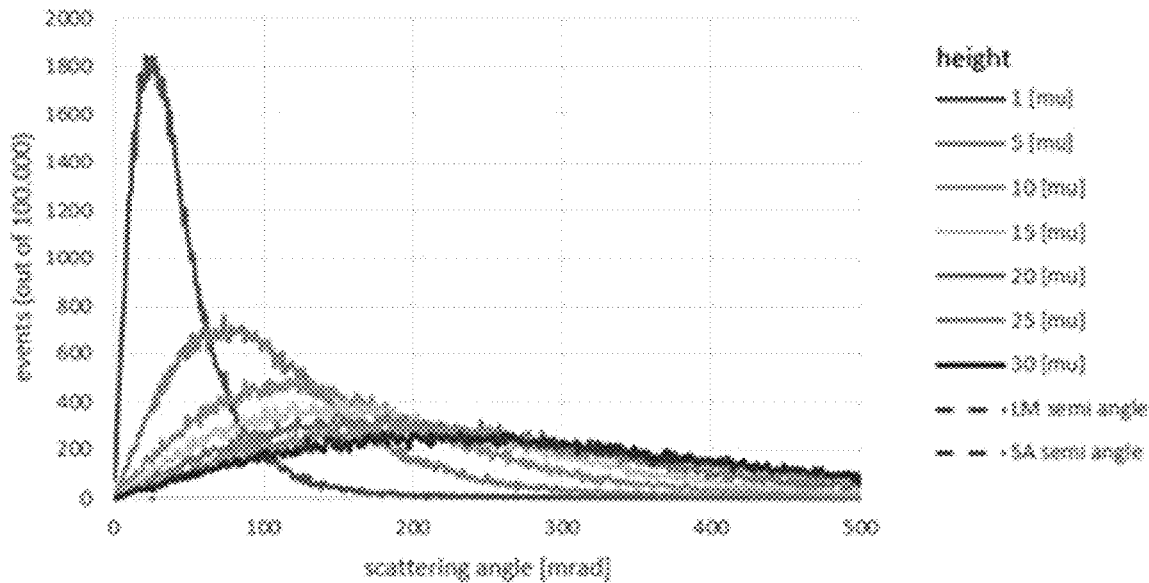
FIG. 12 is a graphical representation of the 300 kV scattering angle through ice and/or dirt within holes of a cryo-EM compatible GUID.
Figure 13:
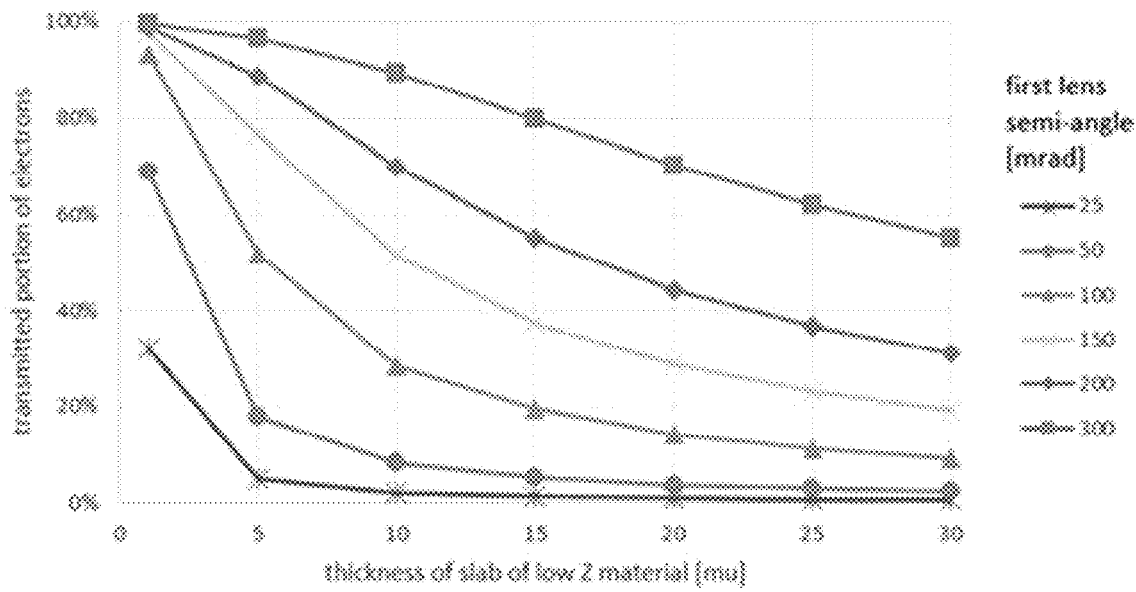
FIG. 13 is a graphical representation of the portion of incident electrons that are transmitted through ice and/or dirt within holes of a cryo-EM compatible GUID at 300 kV.

FIGS. 12 and 13 are graphical representations of the results of a simulation of electrons passing through different heights/thicknesses of the model material GlassyCarbon. GlassyCarbon has a density and atomic mass relatively close to an expected mixture of vitrified sample solution that might fill a hole of a cryo-EM compatible GUID. FIG. 12 is a graphical representation 1200 of the 300 kV scattering angle through a material within holes of a cryo-EM compatible GUID. Specifically, FIG. 12 depicts the number of simulated electrons (out of 100,000) that exhibit each scattering angle (measured in mrad) at different heights/thicknesses of the model material GlassyCarbon. For the simulation, the spread in the exit trajectories of the transmitted electrons are recorded at the bottom plane of the slab of GlassyCarbon.

FIG. 13 is a graphical representation 1300 of the portion of incident electrons that are transmitted through a material within holes of a cryo-EM compatible GUID at 300 kV. Specifically, FIG. 13 depicts the portion of the electrons at each heights/thicknesses of the model material GlassyCarbon that are transmitted by the objective lens of a project lens system of an electron microscope at different objective lens semi-angles (measured in mrad). In the graphical representation 1200 it can be seen that using a small semi angle, like <13 mrad when with objective lens is disabled (i.e., the TEM is operating in LM mode), even a thin layer of a few microns of material filling the hole will move the electron trajectories outside the acceptance angle of projection lens system. However, graphical representation 1200 also shows that by enabling the objective lens in the projection lens system (i.e., the TEM is operating in SA mode), for which the acceptance angle is significantly larger (typically in the range of 130 mrad or more), a larger amount of scattered electrons are captured. As a result, when an TEM operates in an SA mode a sufficiently large detectable signal is obtained even when an entire hole of a cryo-EM compatible GUID is filled with 30 microns of material.

Examples of inventive subject matter according to the present disclosure are described in the following enumerated paragraphs.

A1. A cryo compatible sample grid, the grid comprising:
an outer support structure that defines a region of the grid for holding one or more samples;
a plurality of inner support structures that define a plurality of apertures, each individual aperture configured to hold a sample;
a first identifier located on the outer support structure; and
a second identifier located within the region of the grid for holding the one or more samples, wherein the second identifier is readable with an electron microscope.

A1.1. The cryo compatible sample grid of paragraph A1, wherein the first identifier is readable with an optical detector.

A1.1.1. The cryo compatible sample grid of paragraph A1, wherein the first identifier is readable with an visible light detector implemented in one or more of a sample storage device, a sample transfer device, a sample modification device, a vitrification device, or the electron microscope.

A1.2. The cryo compatible sample grid of any of paragraphs A1-A1.1, wherein the second identifier is readable with an electron detector.

A2. The cryo compatible sample grid of any of paragraphs A1-A1.2, wherein the cryo compatible sample grid is configured to:
receive the one or more samples;
go through a vitrification process in which the one or more samples are vitrified; and
facilitate the examination of the vitrified samples with the electron microscope after vitrification.

A3. The cryo compatible sample grid of any of paragraphs A1 and A2, wherein each of the first identifier and the second identifier are vitrification compatible.

A3.1. The cryo compatible sample grid of paragraphs A3, wherein each of the first identifier and the second identifier do not add thermal mass to the cryo compatible sample grid.

A4. The cryo compatible sample grid of any of paragraphs A1-A3.1, wherein the first identifier is readable before a/the vitrification process.

A4.1. The cryo compatible sample grid of paragraphs A4, wherein the first identifier is readable after the vitrification process.

A4.2. The cryo compatible sample grid of any of paragraphs A4-A4.1, wherein the first identifier is generated on the cryo compatible sample grid via at least one of:
surface roughening of a surface of the outer support structure by a laser or ion beam;
surface structuring with a laser or ion beam;
mechanical imprinting on the surface of the outer support structure;
mechanical scratching to deform the surface of the outer support structure;
additive marking onto the outer support structure;
chemical coloring of the surface of the outer support structure;
chemical etching to remove surface material of the outer support structure;
electrical discharge machining (EDM) to remove surface material of the outer support structure;
drilling of the outer support structure; and
using a photoresist process to color the surface of the outer support structure.

A4.3. The cryo compatible sample grid of any of paragraphs A4-A4.2, wherein the first identifier is one of a bar code, a QR code, a data matrix, and an alpha-numeric code.

A4.4. The cryo compatible sample grid of any of paragraphs A4-A4.3, wherein the first identifier is a globally unique identifier.

A4.5. The cryo compatible sample grid of any of paragraphs A4-A4.4, wherein the first identifier comprises a first portion that encodes a globally unique identifier and a second portion that encodes for specific properties of the sample grid.

A5. The cryo compatible sample grid of any of paragraphs A2-A4.4, wherein the second identifier is readable after the vitrification process.

A5.1. The cryo compatible sample grid of paragraphs A5, wherein the second identifier is repeated at multiple locations within the region of the grid for holding one or more samples.

A5.2. The cryo compatible sample grid of any of paragraphs A5-A5.1, wherein the second identifier comprises one or more teeth that project outward from a particular inner support structure of the plurality of inner support structures and into a corresponding aperture.

A5.2.1. The cryo compatible sample grid of paragraphs A5.2, wherein each of the teeth of the one or more teeth are separated from each other by a distance within the range of 1 mu to 10 mu.

A5.3. The cryo compatible sample grid of any of paragraphs A5-A5.2.1, wherein the second identifier comprises a plurality of holes.

A5.3.1. The cryo compatible sample grid of paragraph A5.3, wherein at least one of the plurality of holes has a different size as a different hole of the plurality of holes.

A5.3.2. The cryo compatible sample grid of any of paragraphs A5.3-A5.3.1, wherein each of the plurality of holes are substantially circular in shape.

A5.3.2.1. The cryo compatible sample grid of paragraph A5.3.2, wherein individual holes of the plurality of holes are located at intersections of inner support structures.

A5.3.3. The cryo compatible sample grid of any of paragraphs A5.3-A5.4.3.1, wherein the plurality of holes are arranged in a linear arrangement.

A5.3.3.1. The cryo compatible sample grid of paragraph A5.3.3, wherein the linear arrangement is positioned along an inner support structure of the plurality of inner support structures.

A5.3.3.1.1. The cryo compatible sample grid of paragraph A5.3.3.1, wherein the linear arrangement is positioned along an edge of the inner support structure of the plurality of inner support structures such that a small piece of an open window with carbon is visible.

A5.3.3.2. The cryo compatible sample grid of paragraph A5.3.3, wherein the second identifier is repeated at multiple locations, and the linear arrangement or each instance of the second identifier is positioned along a different inner support structure of the plurality of inner support structures.

A5.3.4. The cryo compatible sample grid of any of paragraphs A5.3-A5.3.2, wherein the plurality of holes are arranged in a non-linear arrangement.

A5.3.4.1. The cryo compatible sample grid of paragraph A5.3.4, wherein the non-linear arrangement is not a rectangular or orthogonal pattern.

A5.3.5. The cryo compatible sample grid of any of paragraphs A5.3-A5.3.2, wherein the second identifier is readable when one or more teeth and/or holes that comprise the second identifier are filled with ice from the vitrification process.

A5.3.6. The cryo compatible sample grid of any of paragraphs A5.3-A5.5, wherein each of the plurality of holes having a diameter within the range of 1 mu to 10 mu.

A5.4. The cryo compatible sample grid of any of paragraphs A5.3-A5.3.2, 5.3.4.1, and 5.3.6, wherein the region of the grid for holding the one or more samples includes an identification surface, the identification surface including the second identifier.

A5.4.1. The cryo compatible sample grid of paragraph A5.4, wherein the identification surface is thermally isolated from the plurality of inner support structures.

A5.4.2. The cryo compatible sample grid of any of paragraphs A5.4-A5.4.1, wherein the identification surface is connected to one or more inner support structures by one or more connecting bridges.

A5.4.2.1. The cryo compatible sample grid of paragraph A5.4.2, wherein individual connecting bridges are configured to thermally isolate the identification surface from the one or more inner support structures.

A5.5. The cryo compatible sample grid of any of paragraphs A5-A5.5.1, wherein the second identifier is a globally unique identifier.

A5.5.1. The cryo compatible sample grid of paragraph A5.5, wherein the second identifier is associated with the first identifier.

A5.5.2. The cryo compatible sample grid of paragraph A5.5, wherein the second identifier is the same as the first identifier.

A5.5.3. The cryo compatible sample grid of any of paragraphs A5.5-A5.5.2, wherein the second identifier also identifies an orientation of the sample grid.

A5.6. The cryo compatible sample grid of any of paragraphs A5-A5.5.3, wherein individual component elements of the second identifier are positioned in a closed density such that they can be imaged without montaging and/or stage movement.

A5.7. The cryo compatible sample grid of any of paragraphs A5-A5.6, wherein the second identifier is positioned proximate to a marker, wherein the marker is visible with a low magnification.

A6. The cryo compatible sample grid of any of paragraphs A1-A5.8, wherein individual samples of the one or more samples comprises a solution that contains one or more specimens.

A6.1. The cryo compatible sample grid of paragraph A6, wherein the vitrification process freezes the solution so that the solution is vitrified, facilitating examination of the one or more specimens with the electron microscope.

B1. A method for identifying a cryo compatible sample grid, the method comprising:
generating an electron microscope image of a cryo compatible sample grid with an electron microscope, wherein the cryo compatible sample grid has been subjected to a vitrification process;
identifying a region of the electron microscope image that includes a vitrification compatible identifier; and
determining, based on the vitrification compatible identifier, an identity of the cryo compatible sample grid.

B1.1. The method of paragraph B1, further comprising determining the identity of a sample on the sample grid based on the vitrification compatible identifier.

B1.2. The method of any of paragraphs B1-B1.1, wherein the electron microscope is a transmission electron microscope having an enabled objective lens.

B1.3. The method of any of paragraphs B1-B1.2, wherein generating the electron microscope image comprises setting the defocus of the electron microscope towards the bottom of an inner support structure of the compatible sample grid and away from a foil that supports a sample.

The method of paragraph B1.3, wherein setting the defocus of the electron microscope towards the bottom of an inner support structure of the compatible sample grid comprises focusing an electron beam at a plane of a bottom surface of the sample grid.

The method of paragraph B1.3, wherein setting the defocus of the electron microscope towards the bottom of an inner support structure of the compatible sample grid comprises focusing an electron beam at a plane of a bottom surface of the inner support structure.

The method of paragraph B1.3, wherein setting the defocus of the electron microscope towards the bottom of an inner support structure of the compatible sample grid comprises focusing an electron beam at an exit plane of a hole, tooth, or cutout of the vitrification compatible identifier.

B2. The method of any of paragraphs B1-B1.3, wherein the vitrification compatible identifier is the second identifier of any of paragraphs A1-A6.1, and the cryo compatible sample grid further comprises a first identifier of any of paragraphs A1-A6.1.

B2.1. The method of any of paragraphs B1 and B2, wherein the cryo compatible sample grid is the cryo compatible sample grid of any of paragraphs A1-A6.1.

B3. The method of any of paragraphs B2 and B2.1, further comprising:
scanning the first identifier; and
storing information about the cryo compatible sample grid and/or a sample on the cryo compatible sample grid in a database associated with the first identifier.

B3.1. The method of paragraph B3, further comprising accessing the database based on the first identifier.

B3.1.1. The method of paragraphs B3.1, further comprising:
retrieving information from the data base based on the first identifier; and
taking actions in the vitrification device based on this information.

B3.2. The method of any of paragraphs B3 and B3.1, further comprising storing information about the cryo compatible sample grid in the database.

B4. The method of any of paragraphs B1-B3.2, further comprising accessing a/the database based on the second identifier.

B4.1. The method of paragraph B4, further comprising storing information about the cryo compatible sample grid in the database.

B4.1.1. The method of paragraph B4.1, wherein the information includes the electron microscope image.

B4.2. The method of any of paragraphs B4-B4.1.1, further comprising causing the electron microscope to perform an action based on the second identifier and information in the database.

B4.2.1. The method of paragraph B4.2, wherein the causing the electron microscope to perform an action comprises:
accessing object settings associated with the second identifier; and
causing the electron microscope to operate according to the object settings associated with the second identifier.

B4.2.2. The method of paragraph B4.2, wherein the causing the electron microscope to perform an action comprises:
accessing object settings associated with the second identifier; and
causing the sample grid to move to the milling position and initiate milling by a focused ion beam.

B4.2.3. The method of paragraph B4.2, wherein the causing the electron microscope to perform an action comprises:
accessing object settings associated with the second identifier; and
causing the electron microscope to capture an image of the sample grid.

B4.3. The method of any of paragraphs B4-B4.2.3, further comprising, calling up a protocol based on the second identifier.

B4.3.1. The method of paragraph B4.3, wherein the protocol includes providing a graphical user interface that presents options for imaging one or more samples in the cryo compatible sample grid.

B4.3.2. The method of any of paragraphs B4.3-B4.3.1, wherein the protocol includes providing a graphical user interface that presents options for imaging one or more samples in the cryo compatible sample grid.

B5. The method of any of paragraphs B2-B4.3.2, wherein generating an electron microscope image of the cryo compatible sample grid with an electron microscope comprises:
generating a first image of a first portion of the second identifier with the electron microscope; and
generating a second image of a second portion of the second identifier that is at least partially different from the first portion of the identifier.

B5.1. The method of paragraph B5, further comprising identifying the cryo compatible sample grid based on the first image and the second image. C1. Use of the cryo compatible sample grid of any of paragraphs A1-A6.1.

C1. Use of the cryo compatible sample grid of any of paragraphs A1-A6.1.

D1. Use of the cryo compatible sample grid of any of paragraphs A1-A6.1 to perform any of the methods of paragraphs B1-B5.1.

What is claimed is:

1. A cryo compatible sample grid, comprising:
an outer support structure that defines a region of the cryo compatible sample grid for holding one or more samples;
a plurality of inner support structures that define a plurality of apertures, each individual aperture configured to hold a sample;
a first identifier located on the outer support structure; and
a second identifier located within the region of the grid for holding the one or more samples, wherein the second identifier is readable with an electron microscope and comprises a plurality of holes, cutouts or teeth and encode a global identifier associated with the cryo compatible sample grid.

2. The cryo compatible sample grid claim 1, wherein the first identifier is readable with a visible light detector implemented in one or more of a sample storage device, a sample transfer device, a sample modification device, a vitrification device, or the electron microscope.

3. The cryo compatible sample grid of claim 1, wherein the cryo compatible sample grid is configured to:
receive the one or more samples;
go through a vitrification process in which the one or more samples are vitrified; and
facilitate an examination of the vitrified samples with the electron microscope after vitrification.

4. The cryo compatible sample grid of claim 1, wherein the first identifier is generated on the cryo compatible sample grid via at least one of:
surface roughening of a surface of the outer support structure by a laser or ion beam;
surface structuring with a laser or ion beam;
mechanical imprinting on the surface of the outer support structure;
mechanical scratching to deform the surface of the outer support structure;
chemical etching to remove surface material of the outer support structure;
electrical discharge machining (EDM) to remove surface material of the outer support structure;
additive marking onto the outer support structure;
chemical coloring of the surface of the outer support structure;
drilling of the outer support structure; and
using a photoresist process to color the surface of the outer support structure.

5. The cryo compatible sample grid of claim 1, wherein the first identifier comprises a first portion that encodes a globally unique identifier and a second portion that encodes for specific properties of the cryo compatible sample grid.

6. The cryo compatible sample grid of claim 1, wherein the second identifier is readable after the cryo compatible sample grid is subjected to a vitrification process.

7. The cryo compatible sample grid of claim 6, wherein the second identifier comprises one or more teeth that project outward from a particular inner support structure of the plurality of inner support structures and into a corresponding aperture, each of the teeth of the one or more teeth are separated from each other by a distance within the range of 1 mu to 10 mu.

8. The cryo compatible sample grid of claim 6, wherein the second identifier comprises a plurality of holes, each of the plurality of holes having a diameter within the range of 1 mu to 10 mu.

9. The cryo compatible sample grid of claim 8, wherein at least one of the plurality of holes has a different size as a different hole of the plurality of holes.

10. The cryo compatible sample grid of claim 8, wherein the plurality of holes are arranged in a linear arrangement that is positioned along an inner support structure of the plurality of inner support structures.

11. The cryo compatible sample grid of claim 6, wherein the second identifier is readable when one or more teeth or holes that comprise the second identifier are filled with ice from the vitrification process.

12. The cryo compatible sample grid of claim 6, wherein the region of the grid for holding the one or more samples includes an identification surface that includes the second identifier, and wherein the identification surface is thermally isolated from the plurality of inner support structures by one or more connecting bridges that connect the identification surface with the inner support structures.

13. The cryo compatible sample grid of claim 1, wherein the second identifier also identifies an orientation of the cryo compatible sample grid.

14. The cryo compatible sample grid of claim 1, wherein the second identifier is positioned proximate to a marker, and wherein the marker is visible with a low magnification.

15. A method for identifying a cryo compatible sample grid, the method comprising:
    generating an electron microscope image of a portion of the cryo compatible sample grid that is configured to hold one or more samples, wherein the cryo compatible sample grid has been subjected to a vitrification process;
    identifying a region of the electron microscope image that includes a vitrification compatible identifier comprising a plurality of holes, cutouts, or teeth in the sample grid, wherein the plurality of holes, cutouts or teeth encode a global identifier associated with the cryo compatible sample grid; and
    determining, based on the vitrification compatible identifier located within the portion of the cryo compatible sample grid that is configured to hold one or more samples, an identity of the cryo compatible sample grid.

16. The method of claim 15, further comprising determining an identity of a sample on the cryo compatible sample grid based on the vitrification compatible identifier.

17. The method of claim 15, wherein the electron microscope is a transmission electron microscope having an enabled objective lens when the electron microscope image is generated.

18. The method of claim 15, wherein generating the electron microscope image comprises focusing an electron beam on a back side of the sample grid.

19. The method of claim 15, wherein the cryo compatible sample grid further includes an optical identifier, and the method further comprising:
    scanning the optical identifier; and
    storing information about the cryo compatible sample grid and/or a sample on the cryo compatible sample grid in a database associated with the optical identifier.

20. The method of claim 15, further comprising:
    accessing object settings associated with the vitrification compatible identifier; and
    causing the electron microscope to operate according to the object settings associated with the vitrification compatible identifier.

* * * * *